US008214724B2

(12) United States Patent
Hiromitsu et al.

(10) Patent No.: US 8,214,724 B2
(45) Date of Patent: Jul. 3, 2012

(54) TRANSMITTING DATA WITH VARIABLE UNIT FOR PLAYBACK

(75) Inventors: Toshiro Hiromitsu, Fujisawa (JP); Seiichi Idei, Machida (JP); Kazuaki Numano, Machida (JP); Yasushi Tsukamoto, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 910 days.

(21) Appl. No.: 12/264,999

(22) Filed: Nov. 5, 2008

(65) Prior Publication Data

US 2009/0119566 A1  May 7, 2009

(30) Foreign Application Priority Data

Nov. 7, 2007  (JP) ................................ 2007-289757

(51) Int. Cl.
 *H03M 13/00* (2006.01)
(52) U.S. Cl. ........................................ 714/779; 714/770
(58) Field of Classification Search .................. 714/779, 714/770
 See application file for complete search history.

(56) References Cited

U.S. PATENT DOCUMENTS 6,807,191 B2 * 10/2004 Fujii et al. ..................... 370/464
7,343,141 B2 * 3/2008 Ellis et al. ..................... 455/132
2002/0067744 A1 * 6/2002 Fujii et al. ..................... 370/535
2003/0066010 A1 * 4/2003 Acton ........................... 714/758
2005/0020223 A1 * 1/2005 Ellis et al. .................. 455/186.1
2007/0055397 A1 * 3/2007 Steinberg ........................ 700/94

FOREIGN PATENT DOCUMENTS

JP  2005-136546 A  5/2005

* cited by examiner

*Primary Examiner* — M. Mujtaba K Chaudry
(74) *Attorney, Agent, or Firm* — Hoffman Warnick LLC; Douglas Lashmit (57) ABSTRACT

Provided is a transmitter for continuously and sequentially transmitting data with a variable unit for playback. The transmitter includes an obtaining section, a buffer, a computing section and a transmitting section. The obtaining section sequentially obtains segment data of the data to be transmitted. The buffer stores an error correction code to correct an error caused in the data by transmission. The computing section computes, every time newly obtained segment data reaches a predetermined size, XOR of the error correction code already stored in the buffer and the newly obtained segment data, and then updates the error correction code with the computed XOR. The transmitting section sequentially transmits the obtained segment data, as well as reads from the buffer and transmits the updated error correction code every time the computing section computes XOR for data in a size corresponding to the unit for playback.

17 Claims, 9 Drawing Sheets

TRANSMITTING DATA WITH VARIABLE UNIT FOR PLAYBACK

FIELD OF THE INVENTION

The present invention relates to a technique for transmitting data with a variable unit for playback. In particular, the present invention relates to a technique for transmitting data such as a moving image, which comprises frames each having a variable data size.

BACKGROUND OF THE INVENTION

In a system for transmitting and receiving data on a moving image and the like, a protocol such as UDP (User Datagram Protocol) is used to ensure real-time transmission. Unlike protocols such as TCP (Transmission Control Protocol), this kind of protocol does not guarantee reachability of a communication packet. Accordingly, a communication packet is sometimes lost.

Refer to the following Patent Document for details on error correction of data: Japanese Patent Application Publication No. 2005-136546.

In order to correctly playback a moving image even when a communication packet is lost, it is effective to use an error correction code. For example, when transmitting a moving image in real time, a transmitter sequentially captures video images, compresses the data, and also computes an error correction code according to the compressed data. Then, the transmitter adds the error correction code to the compressed data and transmits the data.

In order to transmit data in real time, each frame of data must be transmitted within a predetermined time period. For this reason, a frame may include an image so complex that the data is compressed only at a low rate. As a result, the transmitter may not transmit the error correction code while failing to obtain the code in time. Usually, to cope with such cases, a transmission buffer is enlarged to cover the delay time occurring from computation of the error correction code. However, this increases latency inhibits real-time transmission of data. Meanwhile, if the computational time is to be reduced by using a different kind of error correction code, achieved error correction performance may not be satisfactory in some cases.

SUMMARY OF THE INVENTION

A first aspect of the present invention provides a transmitter for continuously and sequentially transmitting data with a variable unit for playback. The transmitter includes an obtaining section, a buffer, a computing section and a transmitting section. The obtaining section sequentially obtains segment data of the data to be transmitted. The buffer stores an error correction code to correct an error caused in the data by transmission. The computing section computes, every time newly obtained segment data among the data to be transmitted reaches a predetermined size, an XORed value of the error correction code already stored in the buffer and the newly obtained segment data, and then updates the error correction code with the computed XORed value. The transmitting section sequentially transmits the sequentially obtained segment data, concurrently with reading from the buffer and transmitting the updated error correction code, every time the computing section updates the error correction code with the computed XORed value, for the latest-obtained segment data of the data corresponding to the unit for playback. In addition, a program for causing a computer to function as the transmitter and a method for transmitting data by use of the transmitter are provided.

A second aspect of the present invention provides a receiver for continuously and sequentially receiving data with a variable unit for playback. The receiver includes a receiving section, an error correction section and an outputting section. The receiving section receives data to be played back, as well as receives, as an error correction code to correct an error in the data to be played back, an XORed value of data pieces obtained by dividing the data to be played back into predetermined sizes. The error correction section performs error correction on the received data to be played back by use of the received error correction code, on condition that the size of the received data to be played back does not reach the unit for playback. The outputting section outputs the data to be played back either on the condition that the size of the received data to be played back reaches the unit for playback, or on the condition that the size of the received data to be played back reaches the unit for playback through performing error correction on the received data to be played back by use of the error correction code. In addition, a program for causing a computer to function as the receiver and a method for receiving data by use of the receiver are provided.

Note that the above summary of the invention does not include all necessary aspects of the present invention, and sub-combinations of groups of these aspects are included in the scope of the invention.

BRIEF DESCRIPTION OF THE DRAWINGS

For a more complete understanding of the present invention and the advantage thereof, reference is now made to the following description taken in conjunction with the accompanying drawings.

DETAILED DESCRIPTION OF THE INVENTION

Hereinafter, the present invention will be described by use of embodiments of the invention. However, the following embodiments are not to limit the invention disclosed in the scope of claims, and not all of combinations of features described in the embodiment are necessarily essential to the solving means of the invention.

Figure 1:
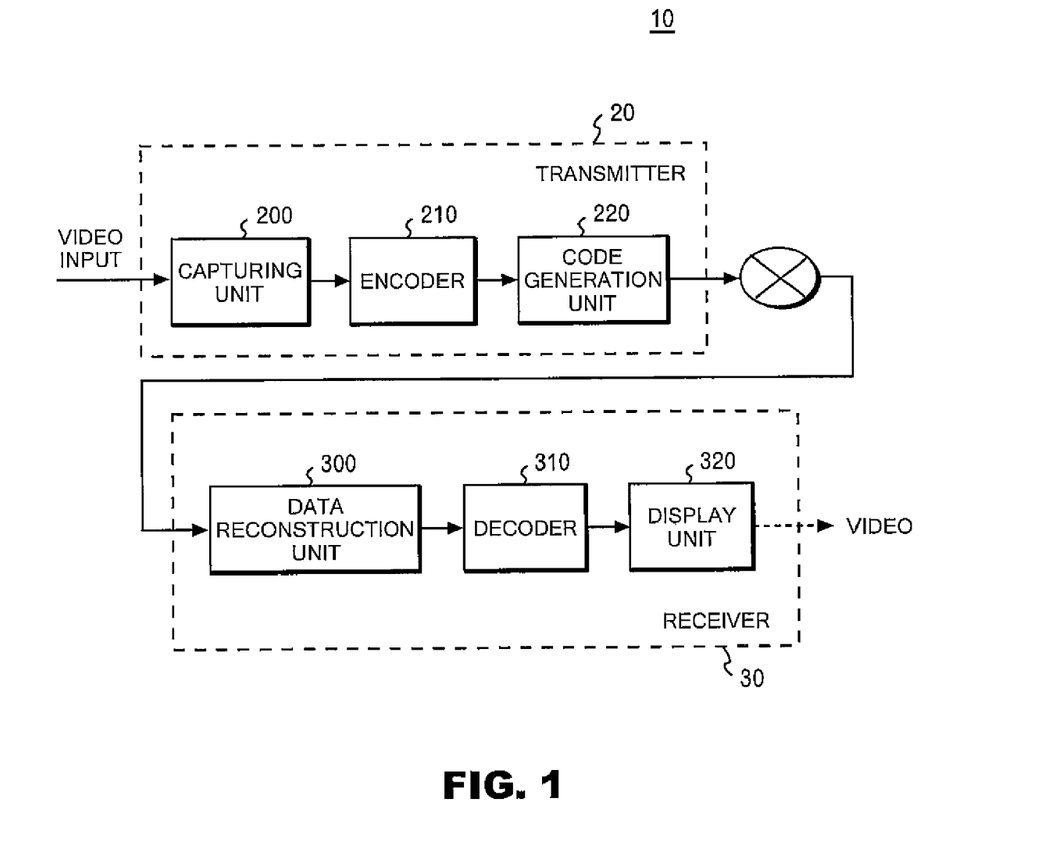
FIG. 1 shows an overall configuration of a communication system according to an embodiment.

FIG. 1 shows an overall configuration of a communication system 10 according to an embodiment of the present invention. The communication system 10 includes a transmitter 20 and a receiver 30. The transmitter 20 encodes a video signal inputted thereto and transmits the resultant signal as digital data in real time. The receiver 30 decodes the received digital data to reconstruct the video, and displays it to a user. Other than a general-purpose computer such as a personal computer, a dedicated device for video transmission may be used as the transmitter 20. Meanwhile, other than a general-purpose computer such as a personal computer, a dedicated device such as a digital TV receiver and a set top box may be used as the receiver 30.

When the reliability of communication between the transmitter 20 and the receiver 30 is low, sometimes the reachability of a communication packet is not guaranteed. For this reason, in addition to a capturing unit 200 and an encoder 210, the transmitter 20 includes a code generation unit 220 for generating an error correction code. The capturing unit 200 captures a video on the basis of a video signal inputted thereto. The captured video is converted into image data configured of frames. The data is referred to as capture data.

The encoder 210 encodes the capture data. The data is encoded for compressing the data size, for example. Specifically, the encoder 210 may, for instance, compress capture data according to standards such as JPEG, JPEG2000 and motion JPEG. In addition, the encoder 210 may compress capture data in GOP (Group of Picture) units, according to standards of interframe compression such as MPEG. GOP is a minimum unit structure constituting a moving image, and is defined by MPEG. In addition, GOP is a video unit in MPEG, which is editable and may be accessed randomly. Data generated by any of these compression methods is called encoded data.

The code generation unit 220 adds an error correction code to the encoded data, and transmits the data to the receiver 30. The receiver 30 includes a data reconstruction unit 300, a decoder 310 and a display unit 320. The data reconstruction unit 300 corrects, by use of the received error correction code, an error in the received encoded data generated during transmission. The decoder 310 decodes the encoded data having undergone the error correction. As a result, the above-mentioned capture data is generated. The display unit 320 provides the video to a user by sequentially displaying the capture data.

Figure 2:
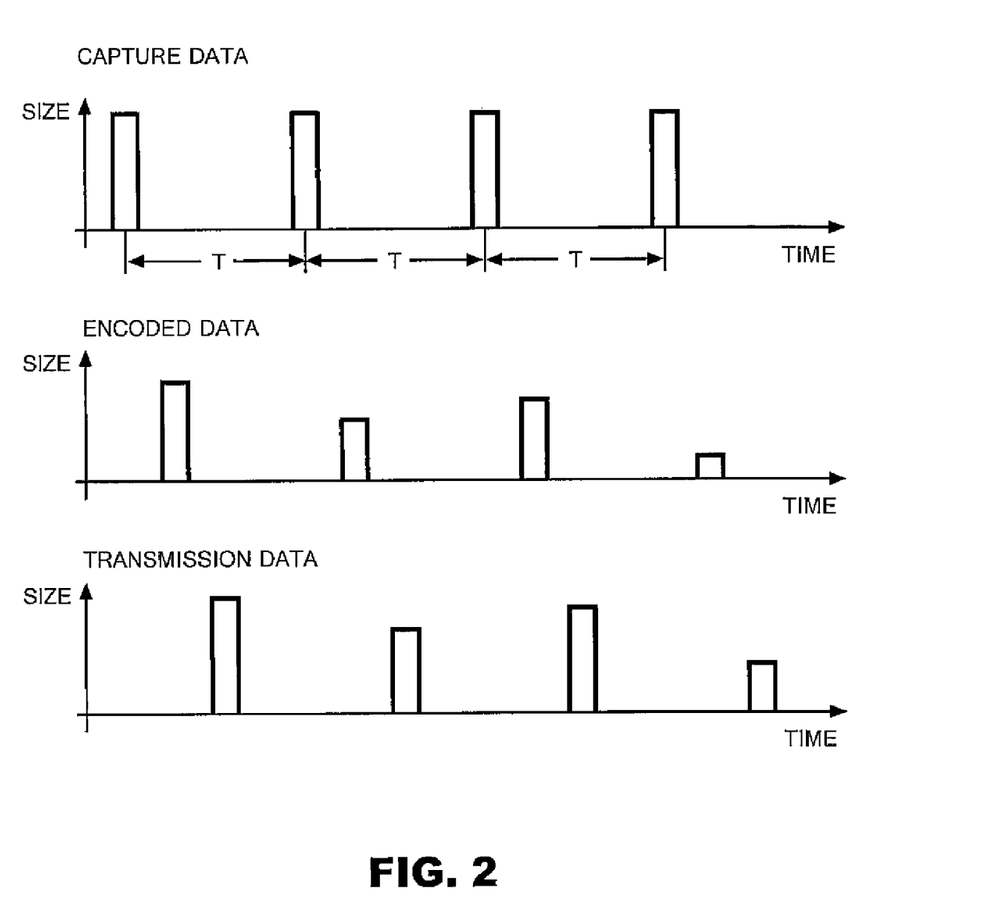
FIG. 2 shows timings at which various data are outputted from a transmitter, and data sizes thereof.

FIG. 2 shows timings at which various data are outputted from the transmitter 20, and the data sizes thereof. The capturing unit 200 captures a video at every predetermined time interval (T), and generates capture data. This time interval (T) is approximately 33 ms (milliseconds), which is the same as the frame interval, for example. Accordingly, a piece of capture data is outputted from the capturing unit 200 in every 33 ms, for example.

The encoder 210 encodes the capture data. The compression rate in encoding differs depending on the content of the capture data. In a case where the capture data is image data, for instance, the compression rate is high for a simple video that mainly consists of a single color such as black. On the other hand, the compression rate tends to be low for a complex image that includes image-data portions having brightnesses and color differences which are significantly different from those in other portions. Consequently, sizes of the encoded data outputted from the encoder 210 differ among the frames.

The code generation unit 220 adds an error correction code to the encoded data. The encoded data is divided into sizes transmittable by transmission packets, and data such as a packet header is added to the divided data. Accordingly, the amount of data outputted from the code generation unit 220 is larger than that of the capture data outputted from the encoder 210. Moreover, the amounts of data outputted from the code generation unit 220 differ among the frames depending on the sizes of the capture data.

As has been described, the data to be transmitted by the transmitter 20 has a variable size in each frame, the frame being the unit for playing back the data. For this reason, in real-time transmission of data, some frames are transmitted within the predetermined transmission time period, and still a sufficient extra time is left after the transmission. Meanwhile, when other frames are transmitted, hardly any extra time is left after the transmission. Accordingly, when the code generation unit 220 uses a code such as a Reed-Solomon code or the like as the error correction code, transmission of the error correction code is sometimes incomplete due to the time-consuming computation thereof. On the other hand, the use of other coding methods that require less computation time results in insufficient error-correction in some cases.

Meanwhile, the code generation unit 220 according to the embodiment sequentially divides the obtained pieces of data into communication-packet sizes before completion of obtaining data for one frame, and sequentially computes an XORed (i.e., exclusively ORed) value (also called as "XOR") of the divided pieces of data. Thereafter, upon completion of obtaining the data for one frame, the code generation unit 220 immediately transmits the XOR as an error correction code. This error correction code is capable of correcting a single packet error for a single frame. Thus, the present embodiment allows data to be transmitted in real time while still computing an error correction code with satisfactory error correction performance. This is made possible by shortening the standby time between the completion of obtaining data for one frame and transmission of the data. Detailed description is as follows.

Figure 3:
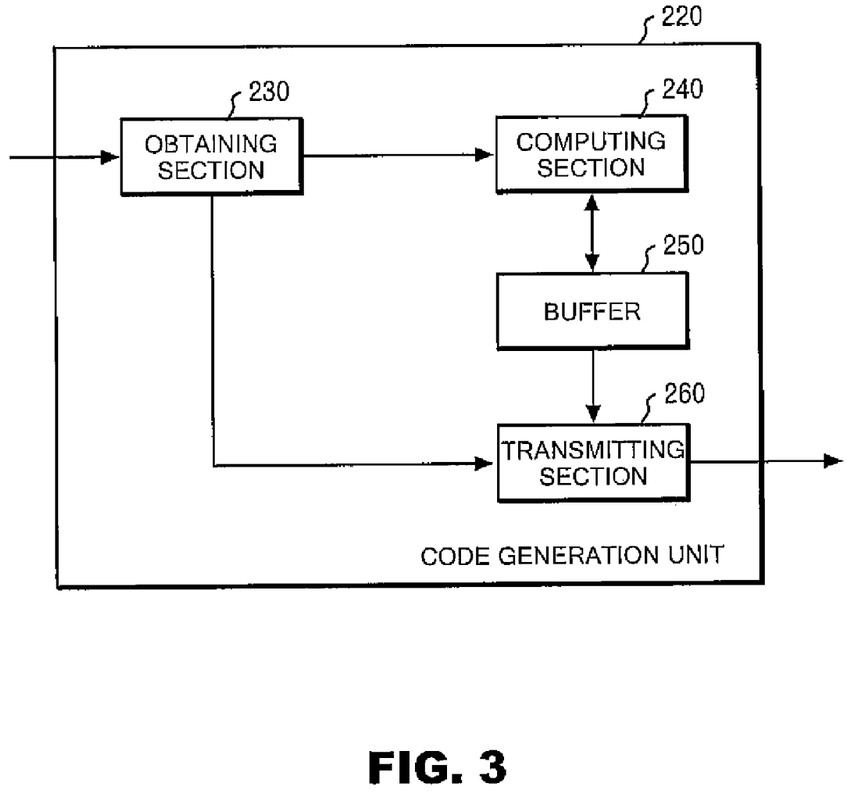
FIG. 3 shows a functional configuration of a code generation unit according to an embodiment.

FIG. 3 shows a functional configuration of the code generation unit 220 according to an embodiment. The code generation unit 220 includes an obtaining section 230, a computing section 240, a buffer 250 and a transmitting section 260. The obtaining section 230 sequentially obtains segments of moving image data (hereinafter, may be simply referred to as segment data) as data to be transmitted (hereinafter, referred to as transmission data), the moving image data consisting of frames having different data sizes. In the moving image data, a single frame may be considered as the unit for playback, for example.

Incidentally, the transmission data is not limited to moving image data, and may be another type of data such as speech data that needs to be transmitted in real time, continuously, and in order. Moreover, the unit for playback is not limited to a frame, and may vary among the type of transmission data. Specifically, the unit for playback may be a predetermined number of frames, or may be a data unit that needs to be played back within a predetermined period (such as several tens of milliseconds).

The buffer 250 is provided to store an error correction code for correcting an error which is generated in data during transmission. The buffer 250 may be implemented by a storage device such as a later-mentioned RAM 1020. Every time the transmitting section 260 transmits data for one frame, the buffer 250 initializes its own content. The buffer 250 may, for instance, clear the error correction code stored therein. Instead of clearing the error correction code to set the value zero, the buffer 250 may overwrite the error correction code with data on a predetermined pattern.

Every time newly obtained segment data reaches a predetermined size after the obtaining section 230 obtains data for one frame previously, the computing section 240 computes XOR of the error correction code already stored in the buffer 250 and the newly obtained segment data. For example, the computing section 240 may compute, in byte units, bitwise XOR of the newly obtained segment data and the error correction code.

The predetermined size is, for instance, the size of data transmitted in a communication packet by the transmitting section 260. In a case where the transmitting section 260 communicates according to UDP (User Datagram Protocol), for example, the communication packet is a UDP communication packet. Accordingly, every time the computing section 240 obtains data in a size transmitted by a UDP packet, the computing section 240 computes XOR.

Incidentally, the predetermined size is not limited to the size transmitted by a communication packet, and may be a size transmitted by a predetermined number of communication packets. However, note that communication protocols such as UDP allow dropout of each communication packet. To deal with this problem and correct the errors appropriately, the aforementioned predetermined size is preferably the size transmitted by a communication packet.

The computing section 240 then updates the error correction code stored in the buffer 250 with the computed XOR. The transmitting section 260 sequentially transmits the segment data sequentially obtained by the obtaining section 230. In addition, every time the computing section 240 computes the XOR for the latest obtained segment data among the data for one frame and updates the error correction code, the transmitting section 260 reads the updated error correction code from the buffer 250, and then transmits the code to the receiver 30.

The transmitting section 260 sequentially transmits the sequentially received segment data, and also determines whether the total size of transmitted data including the error correction code reaches an upper limit size predetermined as transmittable for one frame. If the total data size does not reach the upper limit size, the transmitting section 260 retransmits at least a part of the sequentially obtained segment data, to an extent that the total size of transmitted data does not exceed the upper limit size. Thus, lost communication packets can be more easily reconstructed by effectively utilizing a communication band to an extent that real-time transmission can be ensured.

Figure 4:
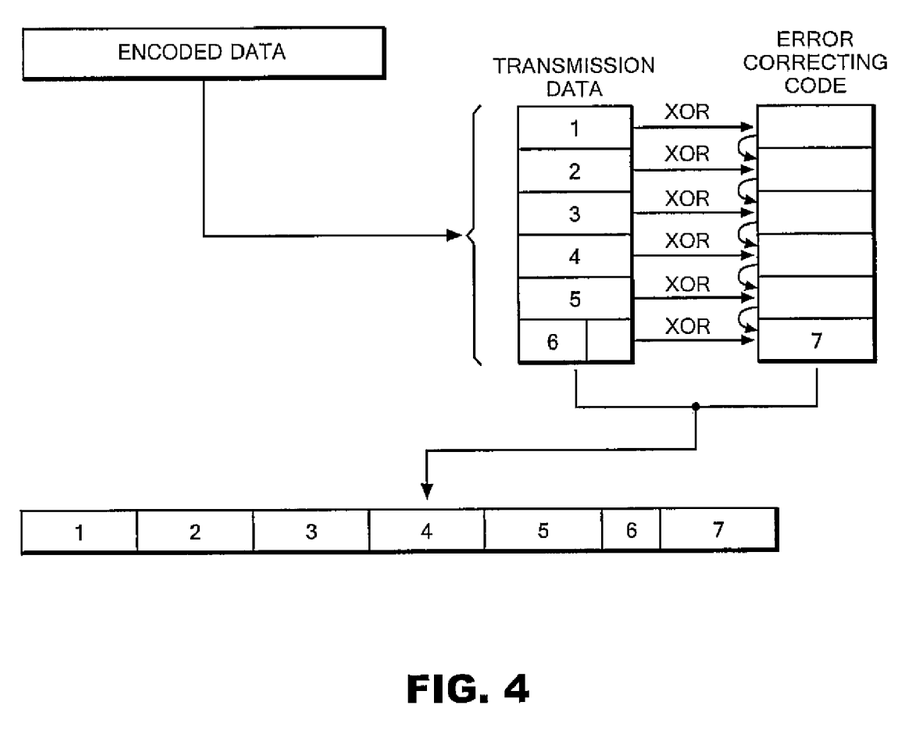
FIG. 4 is a conceptual diagram of processing by the code generation unit according to an embodiment.

FIG. 4 is a conceptual diagram of processing by the code generation unit 220 according to an embodiment. The computing section 240 divides the encoded data for one frame, outputted from the encoder 210, into data sizes each transmitted by a communication packet. Assume that the multiple pieces of data thus divided are pieces of data 1 to 6.

The computing section 240 then computes XOR for each divided piece of data, and stores the XOR as an error correction code, in the buffer 250. Assume that the error correction code is data 7. The transmitting section 260 adds the data 7, that is, the error correction code, to the divided pieces of data 1 to 6, and transmits the resultant data to the receiver 30.

Figure 5:
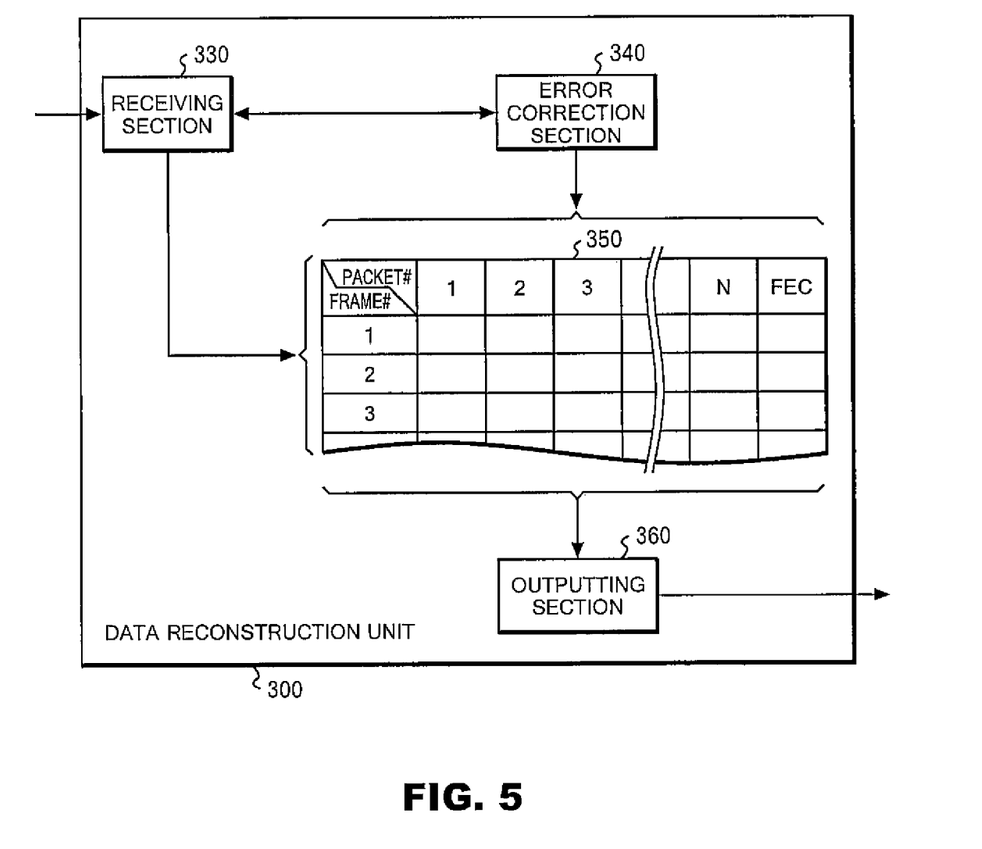
FIG. 5 shows a functional configuration of a data reconstruction unit according to the embodiment.

FIG. 5 shows a functional configuration of the data reconstruction unit 300 according to an embodiment. The data reconstruction unit 300 includes a receiving section 330, an error correction section 340, a buffer 350 and an outputting section 360. The receiving section 330 receives data to be played back (referred to as "playback data" below) from the transmitter 20. The playback data is moving image data, and its unit for playback is one frame of the moving image data, for example.

Additionally, the receiving section 330 receives XOR of pieces of the playback data which have been divided into predetermined sizes. The XOR is received as an error correction code for correcting an error in the playback data. Here, for instance, the predetermined size is a size of data transmitted by a communication packet that the receiving section 330 receives.

The buffer 350 is provided to store the playback data received through the receiving section 330, for each of the frames and also for each of the communication packets by which the data is transmitted. The receiving section 330 sequentially stores, in the buffer 350, the received playback data for each of the received communication packets and for each of the frames.

A concrete example of processing performed by the receiving section 330 is as follows. Firstly, the receiving section 330 reads a packet number from the header of a received communication packet. This packet number indicates the sequence number of the piece of data transmitted by this communication packet in the same frame. Additionally, the receiving section 330 analyzes the content of the received communication packet, to specify the number of the frame that contains the data transmitted by this communication packet.

The receiving section 330 then stores the communication packet to a storage region in the buffer 350 corresponding to the specified packet number and frame number. Moreover, when it turns out, by analyzing the received communication packet, that an error correction code is included in the communication packet, the receiving section 330 stores the received error correction code, for each of the frames, in an FEC (Forward Error Correction) field in the buffer 350.

Storing of communication packets for a large number of frames causes the buffer 350 to have an excessively large amount of the required capacity. For this reason, for instance, the capacity of the buffer 350 for storing the playback data may be limited to only a predetermined number of frames. Moreover, upon receipt of the playback data on a new frame, the receiving section 330 may overwrite data on the frame which has been received least recently among the frames including data stored in the buffer 350, with the data on the new frame.

The error correction section 340 judges whether the size of the received playback data has reached one frame which is the unit for playback. This judgment is made by scanning the buffer 350, for example. Specifically, the error correction section 340 scans the buffer 350 to judge whether all of communication packets corresponding to a certain frame have been stored in the buffer 350.

The number of communication packets of the certain frame is, for example, stored in the header portion of a communication packet. In other words, the error correction section 340 reads the total number of communication packets which corresponds to the certain frame from the header portion of the communication packet or the like, and judges whether the read number of communication packets are stored in the buffer 350.

If the read number of communication packets are not stored in the buffer 350, the error correction section 340 judges, for the certain frame, whether all the other communication packets except one are stored in the buffer 350. Thereafter, on condition that these communication packets are stored in the buffer 350, the error correction section 340 performs error correction on the stored playback data by use of the received error correction code.

For each of the frames, the outputting section 360 outputs the received playback data on condition that the size of the playback data reaches the size of the frame. In addition, on condition that error correction is performed on the received playback data by the error correction section 340, the outputting section 360 outputs the playback data having undergone the error correction.

Figure 6:
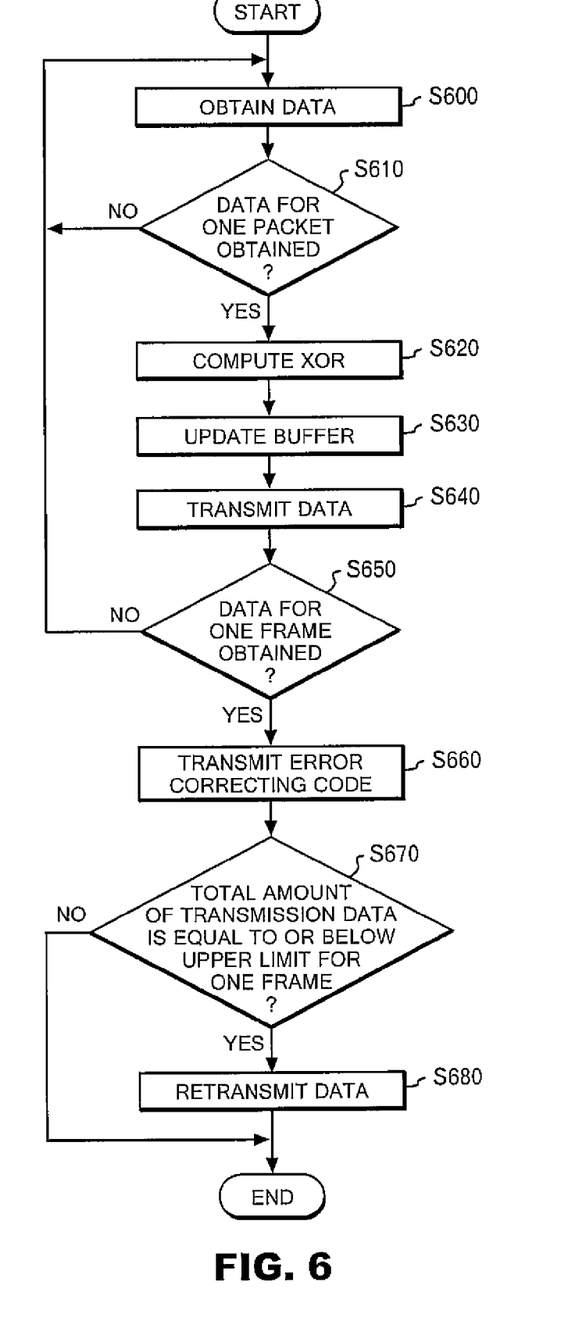
FIG. 6 shows an exemplar flow of processing by the code generation unit according to an embodiment.

FIG. 6 shows an exemplar flow of processing by the code generation unit 220 according to an embodiment. The obtaining section 230 sequentially obtains data sequentially outputted from the encoder 210, in the amount of segment data, as transmission data (S600). The computing section 240 then judges whether the newly obtained segment data among the transmission data reaches the size transmitted by a communication packet (S610).

In a case where the newly obtained segment data of the transmission data does not reach the size transmitted by a communication packet (S610: NO), the processing returns to S600, and the obtaining section 230 obtains more transmission data. Incidentally, even in this case, the processing proceeds to S620 and the computing section 240 computes XOR if the total size of the sequentially obtained segment data reaches the data size for one frame.

When the size of the obtained transmission data reaches the size transmitted by a communication packet (S610: YES), or when data for one frame is obtained, the computing section 240 computes XOR (S620). To be specific, the computing section 240 computes XOR of the error correction code already stored in the buffer 250 and the newly obtained transmission data. With the computed XOR, the computing section 240 updates the error correction code stored in the buffer 250 (S630).

The transmitting section 260 sequentially transmits pieces of the transmission data sequentially obtained by the obtaining section 230 (S640). Note that the timing at which the transmitting section 260 transmits the transmission data is not limited to this timing in S640. Specifically, for example, as long as the timing is after the obtaining section 230 obtains data for one packet, the transmitting section 260 may transmit the data before the computing section 240 computes XOR. Otherwise, the transmitting section 260 may transmit the data while the computing section 240 is computing XOR.

The transmitting section 260 also judges whether the computing section 240 has computed XOR for one frame of the transmission data (S650). If the computing section 240 has not computed XOR for one frame of the transmission data (S650: NO), the processing returns to the S600 and the obtaining section 230 obtains the next piece of data.

Every time the computing section 240 computes XOR for one frame of the transmission data (S650: YES), the transmitting section 260 reads the error correction code from the buffer 250 and transmits it to the receiver 30 (S660). After the error correction code is read, it is preferable that the content of the buffer 250 be cleared.

Additionally, the transmitting section 260 judges whether the total size of transmitted data is below an upper limit size predetermined as transmittable for one frame, even after the transmission data and the error correction code have been transmitted (S670). If the total size is below the upper limit size (S670: YES), the transmitting section 260 retransmits at least a part of the transmission data to an extent that the total size of transmitted data does not exceed the upper limit size (S680).

Figure 7:
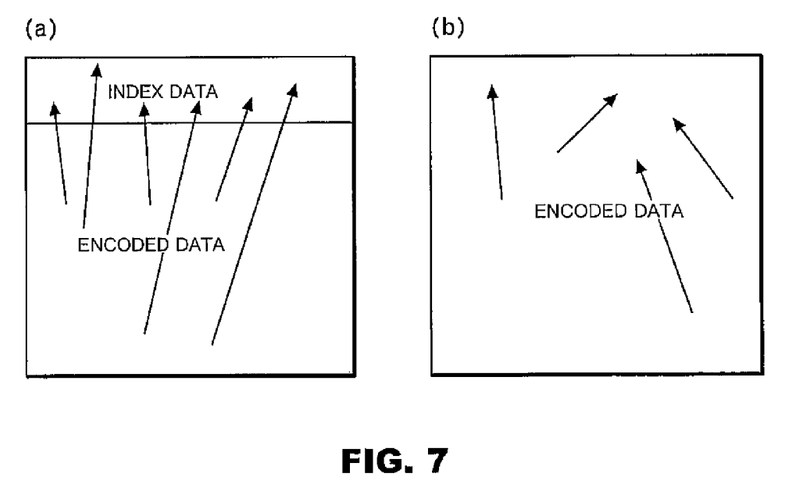
FIGS. 7A and 7B are examples of data obtained by an obtaining section according to an embodiment.

The transmitting section 260 may retransmit the sequentially obtained transmission data in the order that the pieces of the corresponding segment data are obtained within the frame where the transmission data belongs. This is because, for instance, earlier-obtained pieces of the segment data include information essential for the reconstruction of an image, when the data is compressed for each frame by the encoder 210. An example thereof is shown in FIG. 7.

FIGS. 7A and 7B show examples of data obtained by the obtaining section 230 according to the embodiment. As shown in FIG. 7A, obtained transmission data sometimes includes index data and encoded data. Index data is data in which a data sequence before compression is associated with the same data sequence having undergone compression.

For example, a piece of index data records a data sequence "11111" being five 1s in a row and a compressed data sequence being "1*5" in association with each other. In other words, for example, the decoder 310 can convert "1*5" appearing in the encoded data into "11111" by referring to the index data.

As shown in FIG. 7B, in obtained transmission data, sometimes a later-obtained piece of data refers to an earlier-obtained piece of data. For instance, assume a case where a data sequence "11111" appears twice and the appearing positions are seven bytes away from each other. Here, the encoder 210 compresses the data size by converting the data sequence "11111" appearing for the second time into "*7". In this case, the decoder 310 can decode the data by converting "*7" appearing in the encoded data into "11111" that appears 7 bytes ahead of the same data.

As have been shown in FIGS. 7A and 7B, earlier-obtained pieces of data are sometimes being referred to by multiple pieces of later-obtained data. In such cases, the later-obtained pieces of data cannot be decoded if the earlier-obtained pieces of data are lost. On the other hand, even if some of the later-obtained pieces of data are lost, most part of the data can be decoded appropriately if the earlier-obtained pieces of data are properly transmitted.

Thus, data is reconstructed more easily in the receiver 30 because the transmitting section 260 sequentially retransmits the communication packets from the earlier-obtained parts in the frame to an extent that real-time transmission can be ensured. Incidentally, when a certain encoding method or compression algorithm is used, important data is not always included in the earlier-obtained communication packets in the frame. In such a case, the transmitting section 260 may select certain communication packets and perform retransmission, instead of retransmitting the earlier-obtained communication packets. Here, the certain communication packets are those previously known to include more important data.

Figure 8:
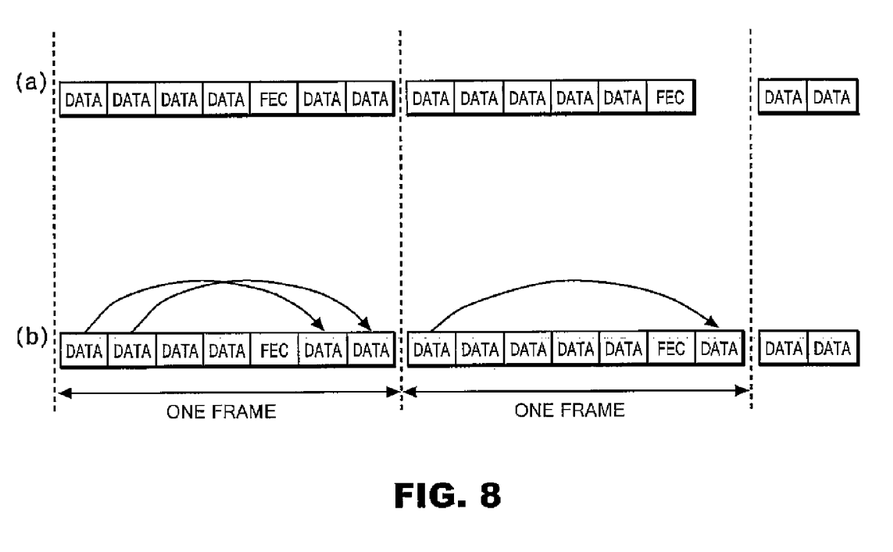
FIGS. 8A and 8B show data to be transmitted by the transmitter according to an embodiment in contrast to another method.

FIGS. 8A and 8B show data to be transmitted by the transmitter 20 according to an embodiment in contrast to another method. As shown in FIG. 8A, even after the transmitting section 260 transmits the transmission data and the error correction code, sometimes the total size of the transmitted data does not reach an upper limit size predetermined as transmittable for one frame.

Meanwhile, as shown in FIG. 8B, the transmitting section 260 sequentially retransmits communication packets from the earlier-obtained parts in the same frame to an extent that the total size of transmitted data does not exceed an upper limit size predetermined as transmittable for one frame. In this way, the original data is more easily reconstructed in the receiver 30.

Figure 9:
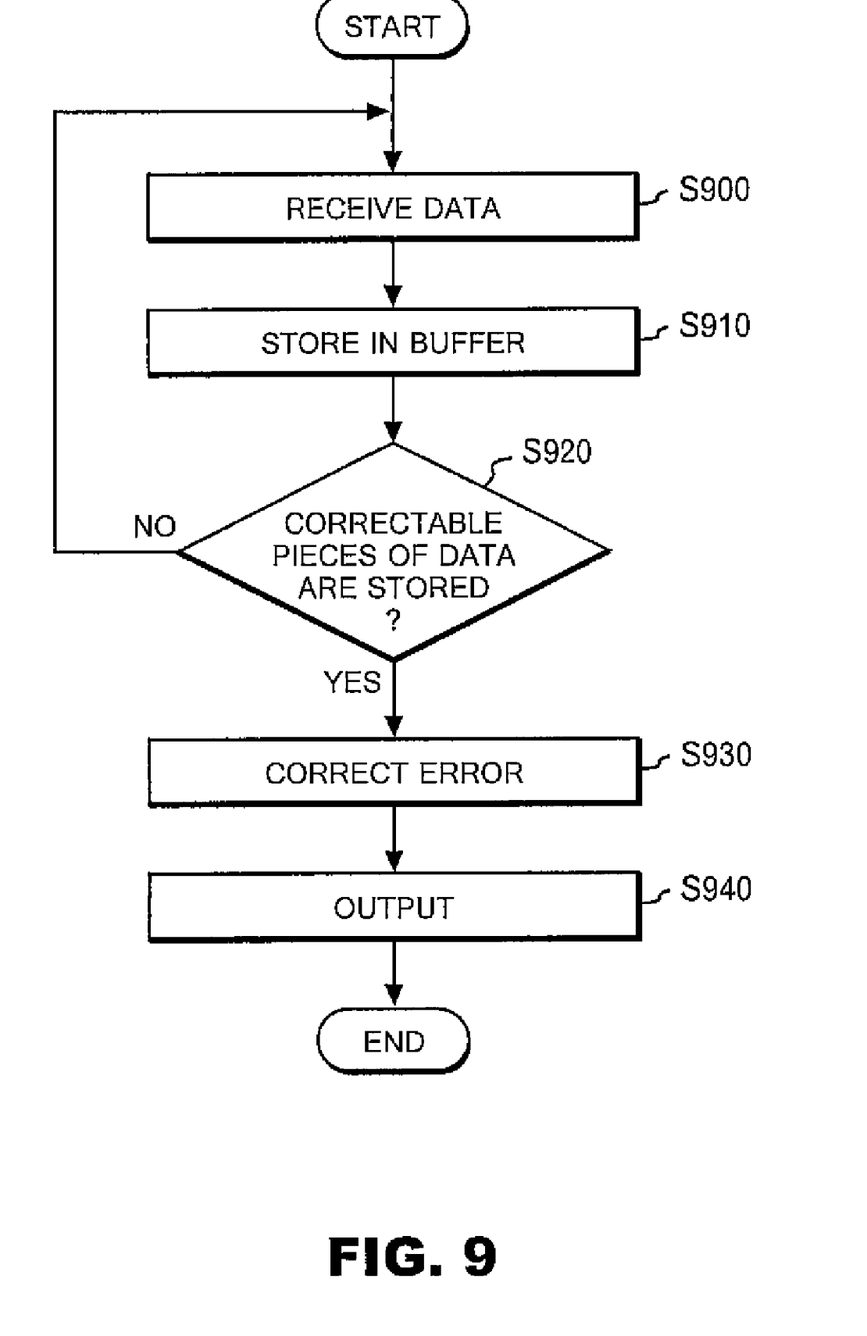
FIG. 9 shows an exemplar flow of processing by the data reconstruction unit 300 according to an embodiment.

FIG. 9 shows an exemplar flow of processing by the data reconstruction unit 300 according to an embodiment. The receiving section 330 sequentially receives, as playback data, multiple communication packets from the transmitter 20 (S900). Moreover, the receiving section 330 receives XOR of pieces of data obtained by dividing the playback data into communication-packet sizes, as an error correction code to correct an error in the playback data.

The receiving section 330 sequentially stores, in the buffer 350, the received pieces of playback data for each of the received communication packets and for each of the frames (S910). In addition, when it turns out, by analyzing the received communication packet, that the error correction code is included in the communication packet, the receiving section 330 stores the received error correction code, for each of the frames, in an FEC (Forward Error Correction) field in the buffer 350.

The error correction section 340 judges, for a certain frame, whether all the other communication packets except one are received (S920). Then, upon receipt of all the other communication packets except one for the certain frame (S920: YES), the error correction section 340 performs error correction on the stored playback data by use of the received error correction code (S930).

For instance, the error correction section 340 computes bitwise XOR of all the other communication packets except one received for the certain frame, and the error correction code. Then, the error correction section 340 stores, in the buffer 350, the computed XOR as the one communication packet yet to be received.

On condition that the error correction section 340 corrects an error in the received playback data, the outputting section 360 outputs the playback data having undergone the error correction (S940).

Note that the outputting section 360 may read the playback data from the buffer 350 without waiting for error correction, in a case where the received playback data for the certain frame reaches one frame which is the unit for playback. In this case, the outputting section 360 outputs the playback data thus read (S940).

Figure 10:
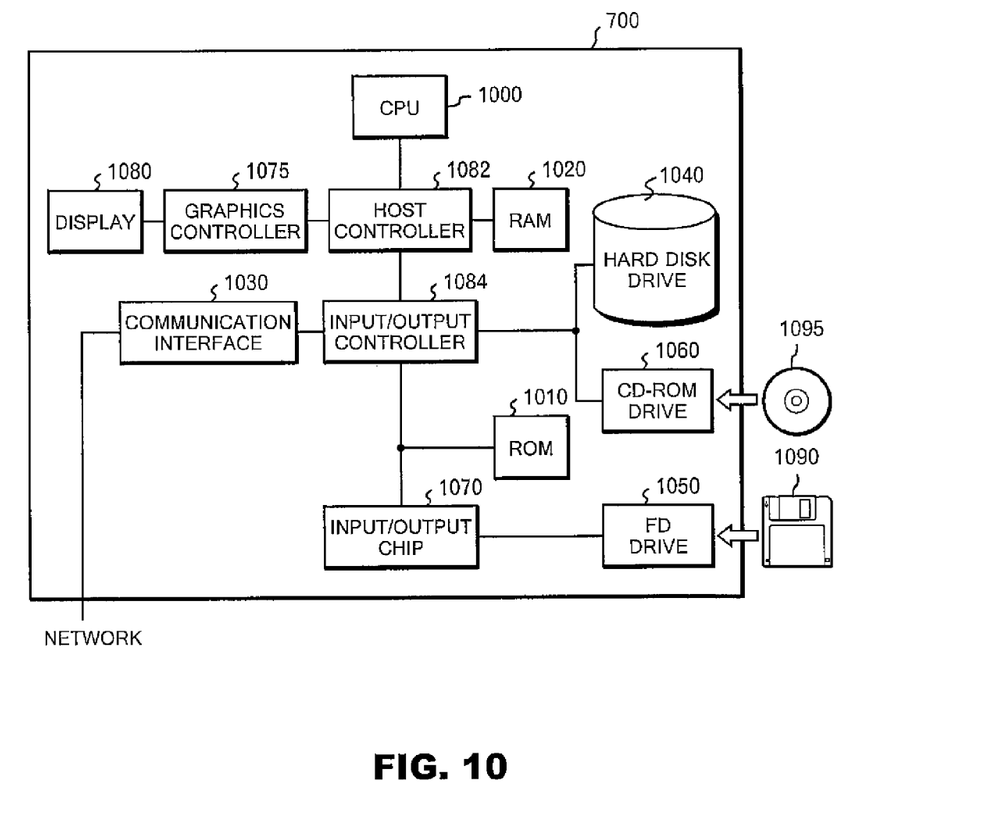
FIG. 10 shows an example of a hardware configuration of a computer functioning as the transmitter or the receiver according to an embodiment.

FIG. 10 shows an example of a hardware configuration of a computer 700 functioning as the transmitter 20 or the receiver 30 according to an embodiment. The computer 700 includes a CPU peripheral unit, an input/output unit and a legacy input/output unit. The CPU peripheral unit includes a CPU 1000, a RAM 1020 and a graphics controller 1075 mutually connected by a host controller 1082. The input/output unit includes a communication interface 1030, a hard disk drive 1040 and a CD-ROM drive 1060 which are connected to the host controller 1082 by an input/output controller 1084. The legacy input/output unit includes a ROM 1010, a flexible disk drive 1050 and an input/output chip 1070 which are connected to the input/output controller 1084.

The host controller 1082 connects the RAM 1020 and the CPU 1000 and graphics controller 1075, which access the RAM 1020 at a high transfer rate. The CPU 1000 operates on the basis of a program stored in the ROM 1010 and the RAM 1020, and controls each of the components. The graphics controller 1075 obtains image data that the CPU 1000 or the like generates on a frame buffer provided in the RAM 1020, and displays the image on a display 1080. Alternatively, the graphics controller 1075 may include therein a frame buffer that stores image data generated by the CPU 1000 or the like.

The input/output controller 1084 connects the host controller 1082 and relatively high-speed input/output devices which are the communication interface 1030, the hard disk drive 1040 and the CD-ROM drive 1060. The communication interface 1030 communicates with an external device via a network. The hard disk drive 1040 stores a program and data used by the computer 700. The CD-ROM drive 1060 reads a program or data from a CD-ROM 1095 and provides the program or data to the RAM 1020 or the hard disk drive 1040.

Moreover, the input/output controller 1084 is connected to the ROM 1010 and relatively low-speed input/output devices such as the flexible disk drive 1050 and the input/output chip 1070. The ROM 1010 stores a boot program that the CPU 1000 executes at the start up of the computer 700, and also stores programs of the computer 700 that are dependent on hardware. The flexible disk drive 1050 reads a program or data from a flexible disk 1090, and provides the program or data to the RAM 1020 or the hard disk drive 1040 through the input/output chip 1070. In addition to the flexible disk drive 1050, the input/output chip 1070 connects various input/output devices via a parallel port, a serial port, a keyboard port, a mouse port and the like, for example.

A program is provided to the computer 700 by a user, and stored in a recording medium such as the flexible disk 1090, the CD-ROM 1095, an IC card or the like. The program is read from the recording medium through the input/output chip 1070 and/or the input/output controller 1084, and then installed to the computer 700 to be executed. The operation that the program causes the computer 700 or the like to perform is the same as the operation of the transmitter 20 or the receiver 30 explained with reference to FIGS. 1 to 9, and therefore the explanation is omitted.

The program as has been described may be stored in an external recording medium. As the recording medium, an optical recording medium such as a DVD or a PD, a magneto-optical recording medium such as an MD, a tape medium, a semiconductor memory such as an IC card or the like may be used in addition to the flexible disk 1090 and the CD-ROM 1095. Otherwise, the program may be provided to the computer 700 via a network by using, as a recording medium, a storage device such as a hard disk or a RAM provided in a server system connected to a dedicated communication network or the Internet.

As has been described with reference to FIGS. 1 to 10, according to the transmitter 20 of the present invention, the latency in transmitting data such as a moving image in real time can be reduced. Here, latency refers to the period between the point of obtaining data for one frame which is the unit for playback, and the point of transmitting the error correction code of the data. Thus, even when a communication protocol having a high transmission rate but not guaranteed reachability of a communication packet is used to maintain real-time transmission of data, the data can more easily be reconstructed in the receiver 30. In addition, since the transmitter 20 retransmits the communication packets to an extent that real-time transmission is maintained, data reconstruction in the receiver 30 is made even further easier.

Hereinabove, the present invention has been described by use of various embodiments. However, the technical scope of the present invention is not limited to the scope of the above embodiments. It is obvious to those skilled in the art that various modifications and improvements may be added to the above embodiments. It is obvious from the scope of claims that such modified or improved embodiments can be included in the technical scope of the present invention.

The invention claimed is:

1. A system for continuously and sequentially transmitting data with a variable unit for playback, comprising:
   an obtaining section for sequentially obtaining segment data of the data to be transmitted;
   a buffer for storing an error correction code to correct an error caused in the data by transmission;
   a computing section for computing, every time newly obtained segment data from the data to be transmitted reaches a predetermined size, an XORed value of the error correction code already stored in the buffer and the newly obtained segment data, and then for updating the error correction code with the computed XORed value; and a transmitting section for sequentially transmitting the sequentially obtained segment data, concurrently with reading from the buffer and transmitting the updated error correction code, every time the computing section updates the error correction code with the computed XORed value, for the latest-obtained segment data of the data corresponding to the unit for playback;

wherein the transmitting section retransmits at least a part of the sequentially obtained segment data to an extent that a total size of the transmitted data does not exceed an upper limit size predetermined as transmittable for one unit of playback, on condition that the total size of the data to be transmitted does not reach the upper limit size even while including the error correction code read from the buffer.

2. The system according to claim 1, wherein
the data to be transmitted represents a moving image;
the unit for playback is one frame of the moving image; and
the predetermined size is the size of data transmitted in one communication packet by the transmitting section.

3. The system according to claim 2, wherein
the obtaining section obtains, as the data to be transmitted, pieces of data whose sizes vary among the frames; and
every time the computing section updates the error correction code after computing an XORed value, for the latest-obtained segment data of the data piece corresponding to one frame of the data to be transmitted, the transmitting section reads from the buffer and transmits the updated error correction code.

4. The system according to claim 1, wherein
the transmitting section retransmits the sequentially obtained segment data in order of obtaining, on condition that the total size of the data to be transmitted does not reach an upper limit size predetermined as transmittable for one unit of playback even while including the error correction code read from the buffer.

5. The system according to claim 1, wherein, on condition that the size of newly obtained segment data after a last computation of an XORed value, does not reach the predetermined size while a total size of the sequentially obtained segment data reaches the unit for playback, the computing section computes an XORed value of the newly obtained segment data and the error correction code already stored in the buffer, and then updates the error correction code with the XORed value.

6. The system of claim 1, further comprising:
a receiver for:
receiving the transmitted segment data and the error correction code;
performing error correction based on the error correction code; and
outputting the segment data.

7. A method for continuously and sequentially transmitting data with a variable unit for playback by use of a transmitter, the transmitter including a buffer for storing an error correction code to correct an error caused in the data by transmission, comprising:
sequentially obtaining segment data of the data to be transmitted;
computing, every time newly obtained segment data from the data to be transmitted reaches a predetermined size, an XORed value of the error correction code already stored in the buffer and the newly obtained segment data, and then updating the error correction code with the computed XORed value; and
sequentially transmitting the sequentially obtained segment data, concurrently with reading from the buffer and transmitting the updated error correction code, every time the error correction code is updated with the computed XORed value, for the latest-obtained segment data of the data corresponding to the unit for playback;

wherein the transmitting retransmits at least a part of the sequentially obtained segment data to an extent that a total size of the transmitted data does not exceed an upper limit size predetermined as transmittable for one unit of playback, on condition that the total size of the data to be transmitted does not reach the upper limit size even while including the error correction code read from the buffer.

8. The method for of claim 7, further comprising:
receiving the transmitted segment data and the error correction code;
performing error correction based on the error correction code; and
outputting the segment data.

9. The method according to claim 7, wherein
the data to be transmitted represents a moving image;
the unit for playback is one frame of the moving image; and
the predetermined size is the size of data transmitted in one communication packet by the transmitting section.

10. The method according to claim 7, wherein
the obtaining obtains, as the data to be transmitted, pieces of data whose sizes vary among the frames; and
every time the computing updates the error correction code after computing an XORed value, for the latest-obtained segment data of the data piece corresponding to one frame of the data to be transmitted, the transmitting reads from the buffer and transmits the updated error correction code.

11. The method according to claim 7, wherein
the transmitting retransmits the sequentially obtained segment data in order of obtaining, on condition that the total size of the data to be transmitted does not reach an upper limit size predetermined as transmittable for one unit of playback even while including the error correction code read from the buffer.

12. The method according to claim 7, wherein, on condition that the size of newly obtained segment data after a last computation of an XORed value, does not reach the predetermined size while a total size of the sequentially obtained segment data reaches the unit for playback, the computing computes an XORed value of the newly obtained segment data and the error correction code already stored in the buffer, and then updates the error correction code with the XORed value.

13. A program, embodied on a non-transitory computer readable medium, for causing a computer to function as a transmitter for continuously and sequentially transmitting data with a variable unit for playback, the computer including a buffer for storing an error correction code to correct an error caused in the data by transmission, and the program, when executed, causing the computer to:
sequentially obtain segment data of the data to be transmitted;
compute, every time newly obtained segment data from the data to be transmitted reaches a predetermined size, an XORed value of the error correction code already stored in the buffer and the newly obtained segment data, and then update the error correction code with the computed XORed value; and
sequentially transmit the sequentially obtained segment data, concurrently with reading from the buffer and transmitting the updated error correction code, every time the computing section updates the error correction code with the computed XORed value, for the latest-obtained segment data of the data corresponding to the unit for playback;

wherein the transmitting retransmits at least a part of the sequentially obtained segment data to an extent that a total size of the transmitted data does not exceed an upper limit size predetermined as transmittable for one unit of playback, on condition that the total size of the data to be transmitted does not reach the upper limit size even while including the error correction code read from the buffer.

14. The program according to claim 13, wherein
the data to be transmitted represents a moving image;
the unit for playback is one frame of the moving image; and
the predetermined size is the size of data transmitted in one communication packet by the transmitting section.

15. The program according to claim 13, wherein
the obtaining obtains, as the data to be transmitted, pieces of data whose sizes vary among the frames; and
every time the computing updates the error correction code after computing an XORed value, for the latest-obtained segment data of the data piece corresponding to one frame of the data to be transmitted, the transmitting reads from the buffer and transmits the updated error correction code.

16. The program according to claim 13, wherein
the transmitting retransmits the sequentially obtained segment data in order of obtaining, on condition that the total size of the data to be transmitted does not reach an upper limit size predetermined as transmittable for one unit of playback even while including the error correction code read from the buffer.

17. The program according to claim 13, wherein, on condition that the size of newly obtained segment data after a last computation of an XORed value, does not reach the predetermined size while a total size of the sequentially obtained segment data reaches the unit for playback, the computing computes an XORed value of the newly obtained segment data and the error correction code already stored in the buffer, and then updates the error correction code with the XORed value.

* * * * *